US007174062B2

(12) United States Patent
Fukuyama et al.

(10) Patent No.: US 7,174,062 B2
(45) Date of Patent: Feb. 6, 2007

(54) OPTICAL DEVICE AND METHOD OF MANUFACTURING SAME

(75) Inventors: Masashi Fukuyama, Inuyama (JP); Yasunori Iwasaki, Nishikasugai-Gun (JP); Akiyoshi Ide, Kasugai (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/952,387

(22) Filed: Sep. 28, 2004

(65) Prior Publication Data

US 2005/0041907 A1 Feb. 24, 2005

Related U.S. Application Data

(63) Continuation of application No. PCT/JP03/03686, filed on Mar. 26, 2003.

(60) Provisional application No. 60/368,532, filed on Mar. 29, 2002.

(30) Foreign Application Priority Data

Dec. 20, 2002 (JP) .............................. 2002-370751
Jan. 27, 2003 (JP) .............................. 2003-017822

(51) Int. Cl.
*G02B 6/12* (2006.01)
*G02B 6/30* (2006.01)
*G02B 6/42* (2006.01)
(52) U.S. Cl. ............................. 385/14; 385/47; 385/49; 385/51
(58) Field of Classification Search ............. 385/88–94
See application file for complete search history.

(56) References Cited

U.S. PATENT DOCUMENTS

| 4,186,996 | A | * | 2/1980 | Bowen et al. ................ 385/92 |
| 4,820,013 | A | * | 4/1989 | Fuse ........................... 385/120 |
| 4,846,543 | A | * | 7/1989 | Kapany et al. ............... 385/46 |
| 4,989,338 | A | | 2/1991 | Tsuji et al. |
| 5,499,309 | A | | 3/1996 | Kozuka et al. |
| 5,930,423 | A | | 7/1999 | Chen et al. |
| 5,940,550 | A | | 8/1999 | Plickert et al. |
| 6,019,523 | A | | 2/2000 | Honmou |
| 6,027,253 | A | | 2/2000 | Ota et al. |

(Continued)

FOREIGN PATENT DOCUMENTS

EP          1312960         5/2003

(Continued)

OTHER PUBLICATIONS

U.S. Appl. No. 11/187,713, filed Jul. 22, 2005, Fukuyama et al.

*Primary Examiner*—Rodney Bovernick
*Assistant Examiner*—Omar Rojas
(74) *Attorney, Agent, or Firm*—Burr & Brown

(57) ABSTRACT

An optical device comprising a first substrate in which V-grooves are made, four optical fibers, for example, having a reflective function and fixed in the V-grooves of the first substrate, an optical element bonded, through an adhesive layer, onto the optical path of a reflected light at least generated by the reflective function on the outside of the clad of each optical fiber, and a second substrate for mounting the optical element, wherein the second substrate is disposed such that the mounting surface of the optical element faces the first substrate.

6 Claims, 6 Drawing Sheets

U.S. PATENT DOCUMENTS

| | | |
|---|---|---|
| 6,048,107 A | 4/2000 | Pubanz |
| 6,250,820 B1 | 6/2001 | Melchior et al. |
| 6,257,772 B1 * | 7/2001 | Nakanishi et al. ............ 385/89 |
| 6,406,196 B1 | 6/2002 | Uno et al. |
| 6,491,447 B2 * | 12/2002 | Aihara ........................ 385/92 |
| 6,507,680 B1 * | 1/2003 | Nishimura et al. ........... 385/89 |
| 6,516,104 B1 * | 2/2003 | Furuyama .................... 385/14 |
| 6,526,204 B1 * | 2/2003 | Sherrer et al. ................ 385/49 |
| 6,542,691 B2 * | 4/2003 | Mizuno et al. ............ 385/146 |
| 6,733,190 B2 | 5/2004 | Kuhara et al. |
| 6,793,410 B2 | 9/2004 | Nakanishi et al. |
| 6,813,418 B1 | 11/2004 | Kragl |
| 2002/0037138 A1 | 3/2002 | Kaneko et al. |
| 2003/0095756 A1 | 5/2003 | Tohgoh et al. |
| 2004/0086231 A1 | 5/2004 | Fukuyama et al. ........ 789/106 |

FOREIGN PATENT DOCUMENTS

| | | |
|---|---|---|
| JP | 50-100467 | 2/1977 |
| JP | 63-191111 A1 | 8/1988 |
| JP | 64-042610 A1 | 2/1989 |
| JP | 02-015203 A1 | 1/1990 |
| JP | 02-030181 | 1/1990 |
| JP | 02-096609 A1 | 4/1990 |
| JP | 03-103804 A1 | 4/1991 |
| JP | 07-030131 | 1/1995 |
| JP | 07-104146 A1 | 4/1995 |
| JP | 07-159658 A1 | 6/1995 |
| JP | WO 97/06458 A1 | 2/1997 |
| JP | 09-120014 A1 | 5/1997 |
| JP | 10-300936 A1 | 11/1998 |
| JP | 11-074496 | 3/1999 |
| JP | 11-133255 A1 | 5/1999 |
| JP | 2000-249874 A1 | 9/2000 |
| JP | 2000-347050 | 12/2000 |
| JP | 2001-100063 A1 | 4/2001 |
| JP | 2001-264594 A1 | 9/2001 |
| JP | 2002-182051 A1 | 6/2002 |
| JP | 2002-182052 A1 | 6/2002 |
| JP | 2002-231974 | 8/2002 |
| JP | 2002-343983 | 11/2002 |
| JP | 2003-156665 A1 | 5/2003 |
| WO | 01/04671 A2 | 1/2001 |

* cited by examiner

OPTICAL DEVICE AND METHOD OF MANUFACTURING SAME

CROSS REFERENCE TO RELATED APPLICATIONS

This application is a continuation of International Application No. PCT/JP03/03686 having an international filing date of Mar. 26, 2003, which designated the United States, which claims the benefit under 35 USC §119(e) of U.S. Provisional Application Ser. No. 60/368,532, filed Mar. 29, 2002, the entireties of which are incorporated herein by reference.

TECHNICAL FIELD

The present invention relates to an optical device having a single optical fiber or a plurality of optical fibers (optical fiber array), or a single optical waveguide or a plurality of optical waveguides or the like, and a method of manufacturing such an optical device, and more particularly to an optical device suitable for monitoring a signal light while it is being propagated through such an optical transmitting means, and a method of manufacturing such an optical device.

BACKGROUND ART

Recently, with the development of wavelength multiplex communications using fiber amplifiers, it has become the practice to monitor the quantity of light in each wavelength with a photodiode (PD), adjust the quantity of light, and amplify the signal light with an amplifier for the purpose of preserving amplifier characteristics.

Various monitoring processes are known in the art. Since a monitoring device is connected to each optical fiber, the monitoring devices alone are of considerable size.

Therefore, there has been a demand for monitoring devices that are smaller in size and higher in packing density. There has also been a demand for monitoring devices that are capable of monitoring a signal light without significantly attenuating the signal light when a portion of the signal light is extracted.

Heretofore, a technique disclosed in Japanese Laid-Open Patent Publication No. 2001-264594 (see FIGS. 24 and 25), for example, has been proposed. According to the disclosed technique, an optical fiber is placed in a V-shaped groove defined in a glass substrate, and thereafter a parallel groove is defined in the glass substrate obliquely across the optical fiber (the optical axis thereof). A light reflecting base (optical member) is inserted into the parallel groove, and an ultraviolet-curable resin (adhesive) is filled in the gap between the light reflecting base and the groove wall.

A light component (reflected light) of the signal light, which propagates through the optical fiber and which is reflected by the light reflecting base, is extracted out through the cladding. The reflected light is detected by a photodetector device, for example, to monitor the signal light.

If a photodiode (PD) is mounted on an optical fiber, then since a single optical fiber is most usually employed, a metal package type PD is typically mounted in place as shown, for example, in Japanese Laid-Open Patent Publication No. 10-300936 (see FIG. 6), Japanese Laid-Open Patent Publication No. 11-133255 (see FIGS. 1 and 4), and WO 97/06458 (see FIG. 4). This is because the single optical fiber poses smaller spatial limitations and numerous metal package type PDs are available on the market and have proven to be effective in terms of cost and reliability.

However, it has been found difficult to combine multiple optical fibers with metal package type PDs. When multiple optical fibers need to be mounted in a high packing density, with a fiber pitch of 250 µm, then it is necessary to install a photodiode array (PD array) made up from a plurality of bare photodiodes.

It is generally customary to extract electric signals from the PD array using a package comprising a plurality of pins.

In the major conventional designs, electrodes are mounted on an upper surface of a V-groove substrate having an optical fiber array fixed thereto, or on an upper surface of an optical waveguide that is optically coupled to the V-groove substrate, and the package is connected by wires through the electrodes, for example, as disclosed in Japanese Laid-Open Patent Publication No. 7-104146 (see FIG. 2), Japanese Laid-Open Patent Publication No. 2-15203 (see FIG. 6(a)), WO 97/06458 (see FIG. 1B), and Japanese Laid-Open Patent Publication No. 7-159658 (see FIG. 1).

One problem common to both conventional arrangements is that, since the electrodes are mounted on the upper surface of the V-groove substrate or on the upper surface of the optical waveguide, there are limitations imposed when connecting the electrodes to the PD array by wires, as well as on the configuration for mounting the PD array.

For providing a connection to the package by wires, e.g., for effecting wire bonding to the pins of the package, since the wires cannot be too long, wires disposed on the upper surface of the V-groove substrate or on the upper surface of the optical waveguide need to be located closely to such pins. This means that the V-groove substrate or the optical waveguide itself needs to be located closely to the pins, resulting in an undue increase in the width of the V-groove substrate or the optical waveguide, and hence increasing costs.

Furthermore, it is necessary to form the electrodes in relative positional alignment with the V-groove substrate or the optical waveguide. However, such an alignment process is highly time-consuming and complex.

Since the electrodes are mounted on the V-groove substrate after the V-groove has been formed in the substrate, or the electrodes are mounted on an optical waveguide which has already been manufactured, if the mounting of the electrodes suffers a defect, then the V-groove substrate or the optical waveguide are also rendered defective, resulting in a yield reduction.

There is a problem inherent in the V-groove substrate, particularly, when the V-groove substrate is made of glass, which is that the surface of the V-groove substrate is frequently ground, and is not in a state of being a mirror surface. When highly packed wires are mounted on such a rough surface, therefore, they are not preferable in terms of characteristics and reliability. During production, the surface of the substrate is ground before the V-groove is formed therein, so that the grinding machine for forming the V-groove and the machined surface of the substrate are kept precisely parallel to each other. Therefore, the V-groove is formed in the substrate only after the surface of the substrate is ground by a surface grinding machine.

Heretofore, apart from mounting electrodes on the surface of a V-groove substrate or onto an optical waveguide, there have been disclosed many examples in which a PD array itself is placed in contact with optical fibers, as shown, for example, in WO 97/06458 (see FIG. 21), Japanese Laid-Open Patent Publication No. 63-191111 (see FIGS. 1 through 3), Japanese Laid-Open Patent Publication No.

2000-249874 (see FIGS. 1 through 4), and Japanese Laid-Open Patent Publication No. 3-103804 (see FIGS. 7(A) and 7(B)). Most of these examples disclose nothing about wiring connections to be made after the installation of the PD array. For making the connection to the package by wires, another wiring board may be placed between the PD array and the optical fiber array, and the PD array may be connected through the other wiring board, or wire bonding may be performed directly from the PD array.

When the PD array is connected by wires through another wiring board, then the other wiring board needs to be newly installed (positioned and bonded) after the PD array has been installed, and then wiring is performed to complete the connection. If direct wire bonding is made from the PD array, then the required wires tend to be quite long and poor in reliability, and further the wire bonding process is highly difficult to perform because complex wiring is made directly from the PD array, which contains highly packed PDs.

For positioning the PD array, it is the general practice to align the PD array while confirming output currents therefrom. According to both the above processes, the positioning process is also highly difficult to perform, as a probe must be applied directly to the PD array during the positioning stage.

Another example, which discloses a mounting process including connections to the PD array by wires, is described in Japanese Laid-Open Patent Publication No. 2002-182052 (see FIG. 2). According to the disclosed example, a PD array is mounted on an auxiliary mount. Specifically, a portion of the PD array is mounted on the auxiliary mount, and another portion (active layer) of the PD array is positioned within the optical path of reflected light using an adhesive interposed therebetween. That is, since any obstacles present in the optical path, which extends to the active layer of the PD array, would prevent the PD array from functioning as a monitor, portions of the PD array other than the active layer are mounted on the auxiliary mount.

With this arrangement, however, when stresses are developed due to curing shrinkage or thermal expansion variations of the adhesive, strain stresses are applied to the PD array since there is a moment fulcrum on the PD array itself. The stresses applied to the PD array are unfavorable because they tend to adversely affect the characteristics thereof, e.g., producing increases in dark current.

The PD array is mounted on the auxiliary mount, and interconnections therefor are likewise formed on the auxiliary mount. If the auxiliary mount suffers warpage or the like, then the assembly suffers various problems such as unreliable conduction or generation of dark current, etc. In view of these shortcomings, the auxiliary mount is required to have a thickness of 0.5 mm or greater. According to the conventional arrangement, therefore, the distance between the optical fiber array and the PD array cannot be reduced to less than 0.5 mm, increasing the possibility of loss of reflected light and crosstalk. Moreover, the auxiliary mount poses limitations on efforts to make the monitor smaller in size and increase monitor performance.

The present invention has been made in view of the above drawbacks. It is an object of the present invention to provide an optical device which makes it possible to position the detecting surface of a photodetector device closely to the surface of an optical transmitting means (e.g., the surface of the cladding of an optical fiber), thus effectively reducing size, increasing detection sensitivity and reducing crosstalk, together with a method of manufacturing such an optical device.

DISCLOSURE OF THE INVENTION

An optical device according to the present invention comprises a first substrate, one or more optical transmitting means mounted on the first substrate and having a reflecting function, an optical element fixedly mounted by an adhesive layer within an optical path of reflected light which is reflected out of the optical transmitting means as a result of the reflecting function, and a second substrate on which the optical element is mounted, wherein the second substrate has a mounting surface on which the optical element is mounted and which faces the first substrate.

The optical transmitting means may comprise an optical fiber, an optical waveguide, or the like. If the optical transmitting means comprises an optical fiber, then the optical device has a first substrate with V-grooves defined therein, one or more optical fibers mounted in the V-grooves in the first substrate and having a reflecting function, an optical element fixedly mounted by an adhesive layer within an optical path of reflected light which is reflected out of the cladding of the optical fibers as a result of the reflecting function, and a second substrate on which the optical element is mounted, wherein the second substrate has a mounting surface on which the optical element is mounted and which faces the first substrate.

When the second substrate is installed on the first substrate, the optical element can face the optical transmitting means and can be positioned closely to surfaces of the optical transmitting means (e.g., the claddings of the optical fibers), thereby effectively reducing size, increasing detection sensitivity, and reducing crosstalk.

With the above arrangement, the optical element installed on the second substrate in advance can be aligned while confirming currents with a probe applied to electrodes on the second substrate.

Since there are no restrictions on distance, for example, as would be caused if the second substrate were interposed between the optical transmitting means and the optical element, the optical element can be positioned closely to the optical transmitting means, even though the optical element is mounted on the second substrate.

Furthermore, according to the present invention, since only an adhesive layer is present across the optical element between surfaces of the optical transmitting means and the optical element, without other obstacles, moment fulcrums due to curing shrinkage or variation in thermal expansion of the adhesive layer do not occur in the optical element. Therefore, the optical element and the second substrate are not subjected to strains, thus providing better characteristics.

Electrodes need to be formed on the surface of the second substrate for connecting to the optical element by wires. The electrodes may be formed on the lower surface of the second substrate (i.e., the mounting surface facing the optical transmitting means) or on the upper surface of the second substrate (i.e., the surface remote from the mounting surface). If the electrodes are formed on the upper surface of the second substrate, through holes may be formed in the second substrate, and electrodes formed on the mounting surface and the electrodes formed on the upper surface may be electrically connected to each other via the through holes.

For stable uniformity of the adhesive layer, the second substrate should preferably be fixed rigidly in position. Moreover, the distance between the optical transmitting means and the optical element should be as short as possible, for preventing the reflected light from spreading. In addition, the adhesive layer should be kept thin to reduce stresses developed over the entirety of the adhesive layer. Since the adhesive layer is present in the optical path of the reflected light, the adhesive layer also should preferably be kept thin to minimize unstable optical characteristics.

The above conditions, particularly, the distance between the optical transmitting means and the optical element should be controlled with high accuracy. From this standpoint, the first substrate should preferably be installed using the mounting surface of the second substrate as a reference.

The first substrate and the mounting surface of the second substrate may have a spacer interposed therebetween.

If the spacer is of a simple shape, then since the thickness of the spacer can accurately be maintained, the functions of the spacer can be performed without fail. More specifically, the distance between the optical transmitting means and the optical element can accurately be set at a desired distance by the spacer. Also, using a spacer which has a simple shape reduces machining costs and hence is economically advantageous.

The reference, which is used to install the first substrate on an end face of the spacer, may be any region which allows the distance to the center of the optical transmitting means to be accurately ascertained, such as the surface (upper surface) of the first substrate on which the optical transmitting means is mounted, or the surface of the optical transmitting means itself (e.g., upper surfaces of the optical fibers).

The spacer may be integral with the first substrate, and the mounting surface of the second substrate may be installed using an end face of the spacer as a reference. Inasmuch as the optical element is mounted on the mounting surface, the distance from the mounting surface to the surface of the optical element, or to an active layer of the optical element, is accurately maintained. The distance from a horizontal plane, which includes the end face of the spacer that is integral with the first substrate, to the center of the optical transmitting means (e.g., centers of the optical fibers) can accurately be ascertained and controlled. When the mounting surface is installed on the end face of the spacer, the distance between the optical transmitting means and the optical element can accurately be managed, by accurately setting the distance between the optical transmitting means and the optical element to a desired distance. Furthermore, since the second substrate has its mounting surface fixed to the first substrate, the second substrate is fixed stably in position.

As described above, the adhesive layer is potentially responsible for producing unstable optical characteristics, which may be dependent on polarization or large wavelengths. Thus, the characteristics of the adhesive layer itself may become factors producing such unstable optical characteristics. It is difficult to cure the adhesive layer, so as to be optically uniform throughout its interior. Furthermore, since the adhesive layer is made of a resin, its coefficient of thermal expansion is large, and temperature variations thereof are large.

One effective solution to the above problems is to make the adhesive layer as thin as possible within the optical path of the reflected light. The thickness of the adhesive layer should preferably be 100 µm or less because thickness in excess of 100 µm tends to render the characteristics (optical characteristics, etc.) thereof unstable.

More preferably, a thickness of 30 µm or less does not produce excessive stresses and allows the adhesive to be cured into the adhesive layer.

Conversely, if the adhesive layer is too thin, it may not be able to exhibit its inherent performance. Specifically, if the adhesive layer is too thin, the materials of the adhesive layer may not be present uniformly within the adhesive layer, but rather, only selectively flowable materials may exist in the adhesive layer, which fail to achieve stable characteristics (optical characteristics, etc.) in each fabricated product. Therefore, to obtain stable characteristics, the thickness of the adhesive layer should be 3 µm or greater.

From another standpoint, an optical device according to the present invention has a first substrate, a plurality of optical transmitting means mounted on the first substrate and having a reflecting function, and an optical element fixedly mounted by an adhesive layer within an optical path of reflected light that is reflected out of the optical transmitting means as a result of the reflecting function, wherein the optical transmitting means and the optical element are disposed with the adhesive layer interposed therebetween, such that any optical effect that the adhesive layer has on the reflected light from the optical transmitting means is substantially uniform.

If the adhesive layer has a thickness in the range of from 3 µm to 100 µm, then stable characteristics (optical characteristics, etc.) can be achieved for each optical transmitting means and hence each optical device.

According to the present invention, a method for manufacturing an optical device is provided, wherein the optical device comprises a first substrate, one or more optical transmitting means mounted on the first substrate and having a reflecting function, an optical element fixedly mounted by an adhesive layer within an optical path of reflected light that is reflected out of the optical transmitting means as a result of the reflecting function, and a second substrate on which the optical element is mounted. The method for manufacturing the optical device comprises the steps of installing one or more optical transmitting means on the first substrate, installing the optical element on a mounting surface of the second substrate, and installing the mounting surface of the second substrate in facing relation to the first substrate, with the adhesive layer being interposed therebetween.

With the above arrangement, when the second substrate is installed on the first substrate, the optical element faces the optical transmitting means and can be positioned closely to surfaces of the optical transmitting means (e.g., the claddings of the optical fibers), thus effectively reducing size, increasing detection sensitivity, and reducing crosstalk.

BEST MODE FOR CARRYING OUT THE INVENTION

An embodiment of an optical device and a method of manufacturing the same according to the present invention, as applied to a 4-channel inline power monitor module, shall be described below with reference to FIGS. 1 through 6.

Figure 1:
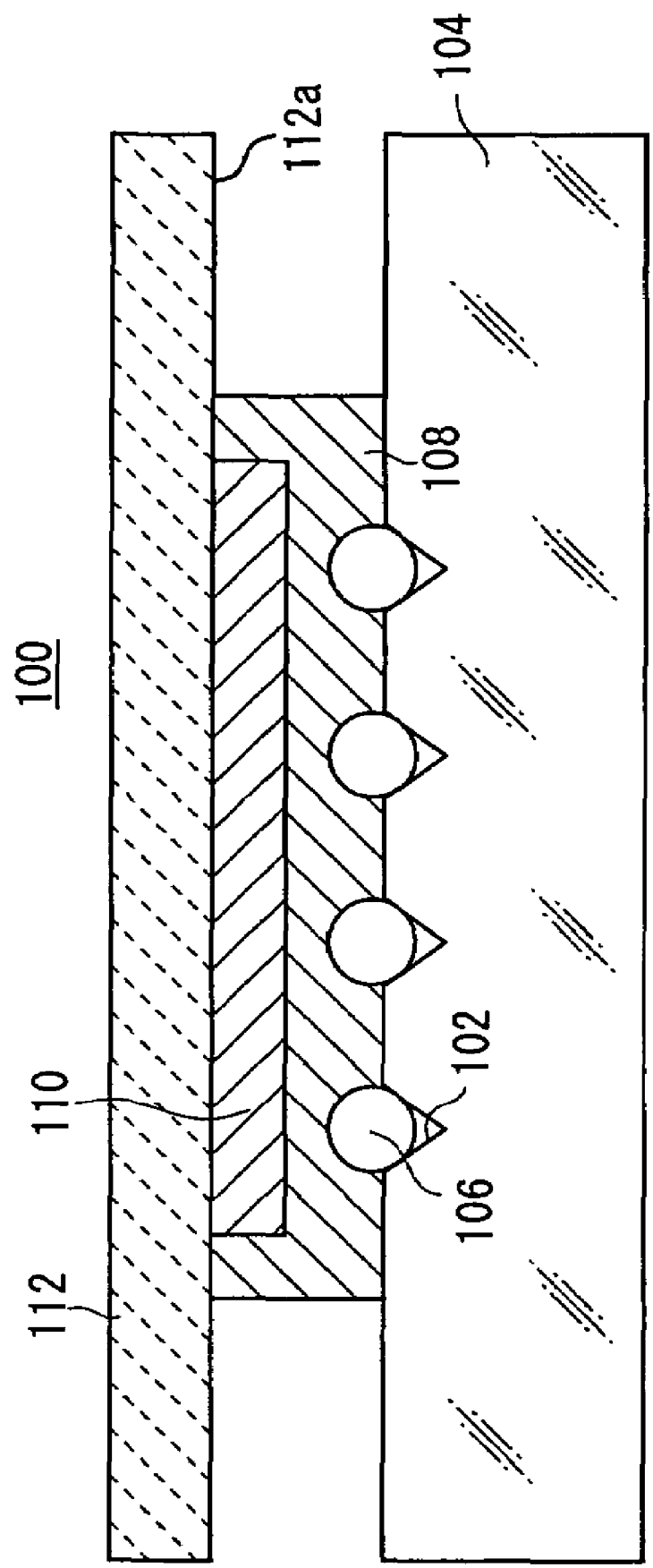
FIG. 1 is a cross-sectional view showing essential parts of an optical device according to an embodiment of the present invention.

As shown in FIG. 1, an optical device 100 according to the present embodiment basically comprises a first substrate 104 with V-grooves 102 defined therein, a plurality of, e.g., four, optical fibers 106 fixedly mounted in the respective V-grooves 102 in the first substrate 104 and having a reflecting function, an optical element 110 fixedly mounted by an adhesive layer 108 within the optical paths of reflected light that is reflected out of the cladding of the optical fibers 106 as a result of at least the reflecting function, and a second substrate 112 on which the optical element 110 is mounted. The second substrate 112 has a mounting surface 112a on which the optical element 110 is mounted and which faces the first substrate 104.

When the second substrate 112 is installed onto the first substrate 104, the optical element 110 faces the optical fibers 106 and can be positioned closely to surfaces of the claddings of the optical fibers 106, thus effectively reducing size, increasing detection sensitivity, and reducing crosstalk.

A specific example of the optical device 100 according to the present embodiment (hereinafter referred to as optical device 100A according to the specific example) will be described below with reference to FIGS. 2 through 6.

Figure 2:
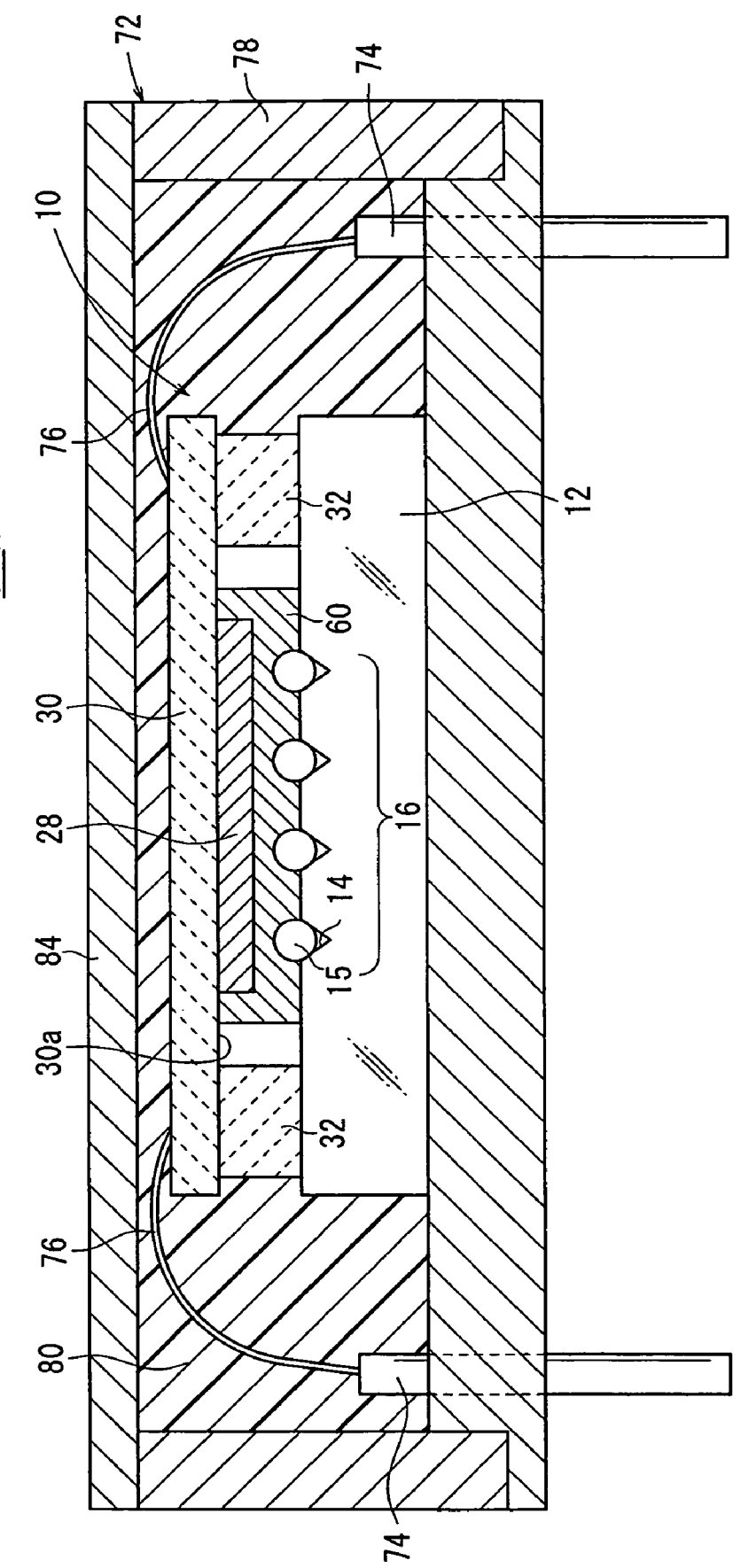
FIG. 2 is a cross-sectional view showing a specific example of the optical device according to the embodiment.

As shown in FIG. 2, the optical device 100A according to the specific example comprises an optical head 10 and a package 72 housing the optical head 10 therein.

Figure 3:
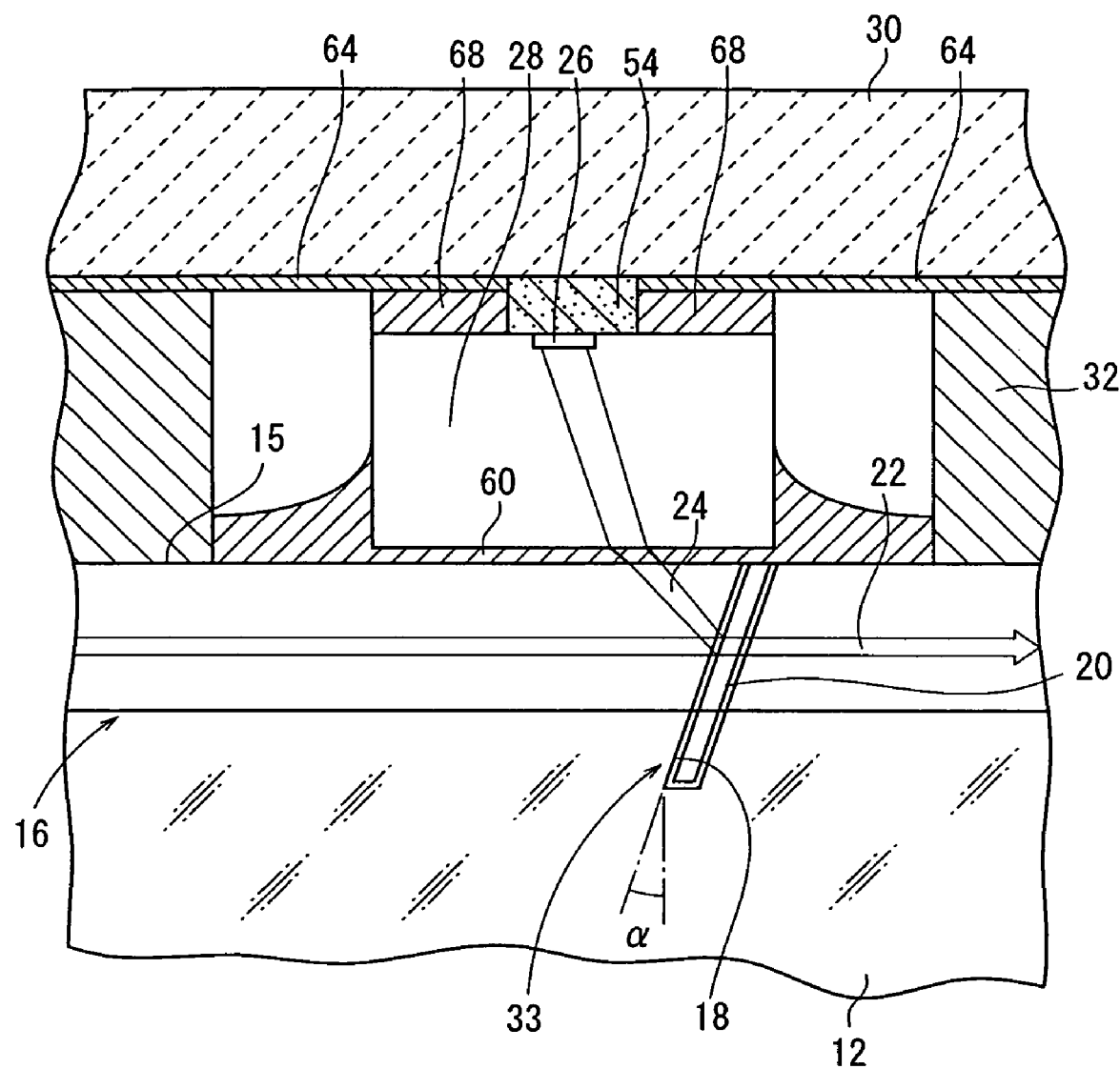
FIG. 3 is a cross-sectional view showing an arrangement of an optical head of the optical device according to the specific example.

As shown in FIGS. 2 and 3, the optical head 10 comprises a glass substrate 12 (corresponding to the first substrate 104), an optical fiber array 16 comprising a plurality of optical fibers 15 fixedly mounted in respective V-grooves 14 defined in the glass substrate 12, a slit 18 (see FIG. 3) extending from upper surfaces of each of the optical fibers 15 to the glass substrate 12, a branching member 20 (see FIG. 3) inserted in the slit 18, a PD (photodiode) array 28 having a plurality of active layers 26 for detecting light (reflected light) 24 reflected by at least the branching member 20, the reflected light consisting of light 22 that passes through each of the optical fibers 15, an auxiliary mount 30 on which the PD array 28 is fixedly mounted so as to face the optical fiber array 16, and spacers 32 for stably securing the PD array 28. The two end faces of the slit 18, the surface and reverse side of the branch member 20 function as a reflector 33 (see FIG. 3) for reflecting a portion of the light 22 that passes through the optical fiber 15.

More specifically, the optical head 10 of the optical device 100A according to the specific example includes the glass substrate 12 with the V-grooves 14 defined therein, the optical fiber array 16 fixedly mounted in the V-grooves 14 of the glass substrate 12, wherein each optical fiber 15 has a reflecting function (this function being accomplished by the slit 18, the branch member 20, etc.), the PD array 28 which is fixedly mounted by an adhesive layer 60 within optical paths of reflected light that is reflected out of the cladding of the optical fibers 106 as a result of the reflecting function, and the auxiliary mount 30 on which the PD array 28 is mounted. The auxiliary mount 30 has a mounting surface 30a on which the PD array 28 is mounted and which faces the glass substrate 12.

A method of manufacturing the optical device 100A according to the specific example shall be described below with reference to FIG. 4.

Figure 4:
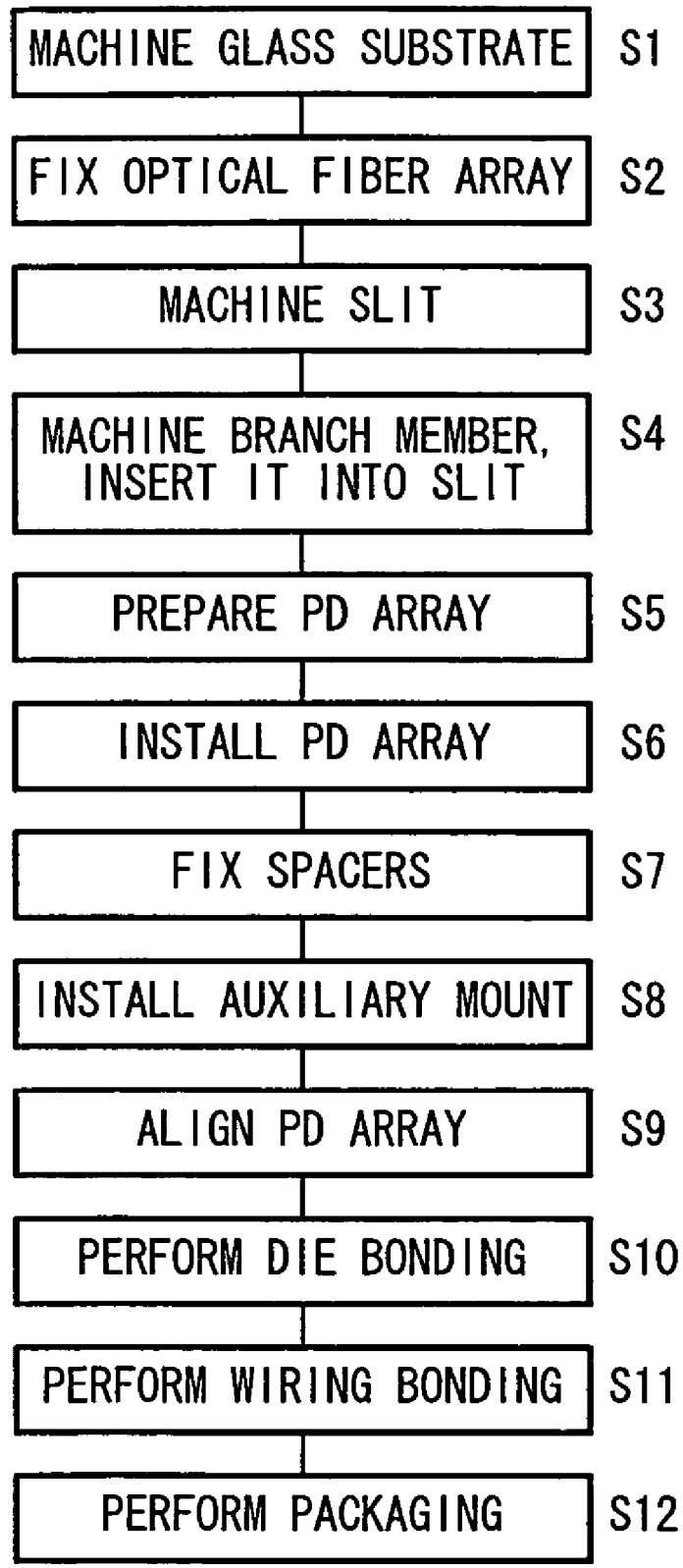
FIG. 4 is a block diagram showing a method of manufacturing the optical device according to the specific example.

As shown in FIG. 4, in step S1, the glass substrate 12 with the V-grooves 14 was fabricated by grinding. The glass substrate 12 was made of a borosilicate glass material (e.g., Pyrex (registered trademark) glass). The V-grooves 14 were machined using a #1500 metal grinding wheel.

The angle of the V-grooves 14 should preferably be 45° or more in view of the load to be applied to each of the optical fibers of the optical fiber array 16 when the slit 18 is subsequently machined, and should preferably be 95° or less for achieving a sufficient amount of adhesive (bonding) strength, in order that the optical fiber array need not require a cover. In this specific example, the angle of the V-grooves 14 was 70°. Further, the V-grooves 14 had a depth that permitted the fibers to project from the upper openings of the V-grooves 14.

Then, in step S2 shown in FIG. 4, the optical fiber array 16 was placed in the V-grooves 14. Then, an ultraviolet-curable adhesive was applied, and cured by ultraviolet rays that were applied from the reverse side of the optical fiber array 16 as well as from above the optical fiber array 16.

In step S3 of FIG. 4, the slit 18 was machined into the optical fiber array 16.

The slit 18 had a thickness of 30 µm, a depth of 200 µm, and a tilt angle $\alpha$ (see FIG. 3) of 20°. The thickness of the slit 18 should preferably be in the range of from 5 to 50 µm. If the thickness of the slit 18 were smaller than 5 µm, then since the member (branch member 20) inserted into the slit 18 would be too thin, it would be difficult to mount the branch member 20. If the thickness of the slit 18 is greater than 50 µm, then excessive optical loss is too large to fulfill actual specifications.

It is preferable that the depth of the slit 18 be in the range of from 130 µm to 250 µm. If the depth of the slit 18 is less than 130 µm, then since the machined groove could possibly be stopped somewhere in the optical fibers 15, the optical fibers 15 could possibly suffer damage starting from the machined groove. By contrast, if the depth of the slit 18 is greater than 250 µm, then the strength of the glass substrate 12 tends to be lowered.

The tilt angle a should desirably be in the range of from 15° to 25°. If the tilt angle a were smaller than 15°, then as described later, crosstalk characteristics of the PD array 28 are liable to become poor. If the tilt angle $\alpha$ is greater than 25°, the polarization dependence of the reflected light 24 at the branch region tends to become poor.

Then, as shown in FIG. 4, in step S4 the branch member 20 was fabricated. The branch member 20 had a substrate of quartz glass. Considering handling of the branch member 20, the branch member 20 may be made of a plastic material, a polymer material, or a polyimide material. However, since the branch member 20 has a large angle of 20°, it should preferably be made of a material whose refractive index is the same as that of the optical fibers 15 (quartz), in order to prevent the optical axis on the transmission side from becoming displaced due to refraction.

A branching multilayer film was formed on the quartz glass substrate. The quartz substrate had a size of 50 mm×50 mm×1 mm. The tilt angle was 20° and the branching ratio was 93% for transmission and 7% for reflection. The film makeup was a multilayer film of $SiO_2$, $TiO_2$, and $Al_2O_3$ formed by evaporation. The wavelength range was designed to be in a range of from 1510 nm to 1630 nm, for flat characteristics (reflectance). The polarization characteristics of the multilayer film itself were optimally designed so as to be less than 0.05 dB for transmission and less than 0.1 dB for reflection. The quartz substrate, with the multilayer film formed thereon, was cut into chips having dimensions of 6 mm×2 mm. The substrate, in the form of such chips, was polished to 25 μm, producing a thin-plate branch member.

The branch member 20 was inserted into the slit 18, an ultraviolet-curable adhesive was applied, and the adhesive was cured by applying ultraviolet rays thereto. The branch member 20 was thus mounted in place.

In step S5 of FIG. 4, the PD array 28 was prepared. As shown in FIG. 3, the PD array 28 was of a reverse-side-incident-type structure. An anisotropic conductive paste 54 was placed on an upper surface of the active layer 26 (closer to the auxiliary mount 30), rather than using Au solder or electrode or silver paste. From the standpoint of reducing crosstalk, it is preferable to use a material having low reflectance, such as an anisotropic conductive paste 54 or air, rather than a material such as Au having high reflectance. The PD array 28 may alternatively comprise a surface-incident-type PD array.

The reverse-side-incident type PD array 28 has a detecting region (active layer 26) having a diameter of about 60 μm. The diameter φ of the detecting region (active layer 26) should preferably be in a range of from 40 to 80 μm. If the diameter of the detecting region (active layer 26) is less than 40 μm, then since the size of the detecting region (active layer 26) is too small, there is concern over a reduction of the PD detecting efficiency. If the diameter of the detecting region (active layer 26) is equal to or greater than 80 μm, then the PD array 28 tends to pick up stray light and suffer from poor crosstalk characteristics.

The auxiliary mount 30 was mounted with the optical fibers 15, the PD array 28, and the auxiliary mount 30, in that order. Although the auxiliary mount 30 could be mounted in a different mounting order, such as a succession of the optical fibers 15, the auxiliary mount 30, and the PD array 28, in this case, since the auxiliary mount 30 would be disposed between the optical fibers 15 and the PD array 28, the optical path of the reflected light 24 would be lengthened, allowing the reflected light 24 to spread largely. Therefore, such an alternative mounting order is not preferable from the standpoints of PD detecting efficiency and crosstalk.

When mounted in succession with the optical fibers 15, the PD array 28, and the auxiliary mount 30, in that order, if the PD array 28 is of the surface-incident type, then wire bonding is needed to provide a conductive path from the surface to the auxiliary mount 30. A space of about 100 μm is required for such wire bonding. In addition, such a space needs to be filled with an adhesive layer 60, for ensuring refractive index matching with the optical fibers 15 (quartz) and reliability. Specifically, if the PD array 28 is of the surface-incident type, then an adhesive layer 60 having a thickness of 100 μm is provided in the optical path, which introduces instability in performance characteristics, such as PDL (polarization dependency) and wavelength dependency. Further, since wires are usually made of metal such as Au, if light is applied to the wires, then such light is scattered as stray light, which is responsible for poor crosstalk.

If the PD array 28 is of the reverse-side-incident type, then the PD array 28 theoretically may be held in contact with the optical fibers 15. However, inasmuch as the PD array 28 and the optical fibers 15, if held in contact with each other, are liable to introduce physical defects, a space of about 10 μm may be left and used as an adhesive layer 60 for safety.

The optical path lengths of both the above arrangements will be compared with each other. If it is assumed that the active layer 26 is present on the substrate surface of the PD array 28 (i.e., the surface facing the optical fibers 15), when using a PD array 28 of the surface-incident type, since the distance between the surface of the optical fibers 15 and the active layer 26 is 100 μm, if the refractive index of the adhesive layer 60 is 1.45 (which is the same as quartz), then the optical path length is $100/1.45 \approx 69$ μm. When using a PD array 28 of the reverse-side-incident type, if the thickness of the adhesive layer 60 is 10 μm and the thickness of the PD array 28 in general is 150 μm, then the optical path length is $10/1.45+150/3.5 \approx 50$ μm. Thus, the optical length when using a PD array 28 of the reverse-side-incident type is shorter and therefore preferable.

The angle of incidence of light on the active layer 26 differs greatly between surface-incident type and reverse-side-incident type PD arrays 28. When using a PD array 28 of the surface-incident type, even if the surface is coated with silicon nitride (refractive index: 1.94), the angle of incidence of light on the PD array 28 is about 35°, assuming that the tilt angle α of the slit 18 is 20°. When using a PD array 28 of the reverse-side-incident type, the angle of incidence of light on the PD array 28 is about 18.5°, which is much smaller than the angle of incidence of light when using a surface-incident type PD array 28, and thus is preferable from the standpoint of PD detection efficiency, etc.

Figure 5A:
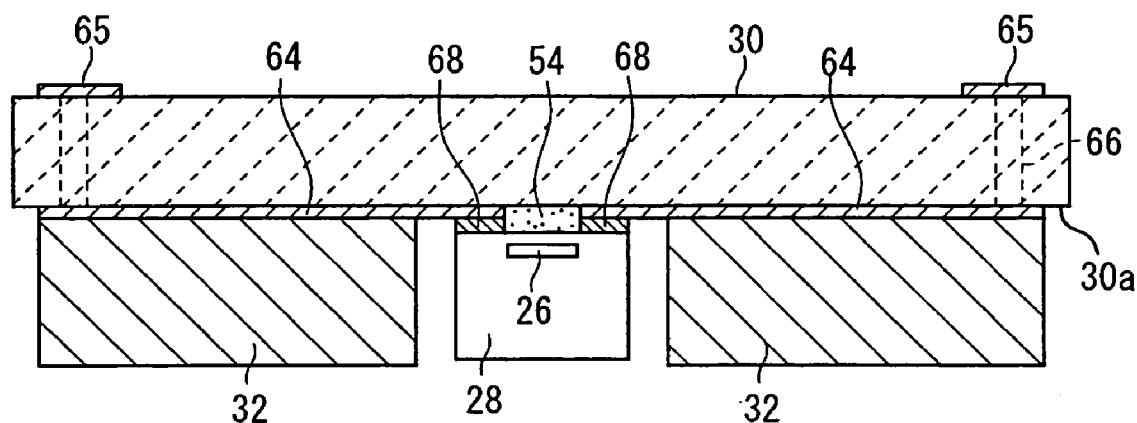
FIG. 5A is a cross-sectional view showing spacers fixed to the lower surface of an auxiliary mount.

As shown in step S6 of FIG. 4, the PD array 28 was installed on an auxiliary mount 30. As described later with reference to FIG. 2, in order to mount the optical fiber array 16 in the package 72 and to provide conduction between the pins 74 of the package 72 and electrode pads of the auxiliary mount 30, Au electrode patterns 64 were formed on a lower surface of the auxiliary mount 30, as shown in FIG. 5A. The PD array 28 was mounted so that the PD array 28 was placed on the lower surface (mounting surface 30a) of the auxiliary mount 30, and the electrode patterns 64 were extended, via through holes 66, to the upper surface of the auxiliary mount 30, thereby forming electrode pads 65 corresponding to the electrode patterns 64. The auxiliary mount 30 was made of $Al_2O_3$.

The reverse-side-incident type PD array 28 has an anode electrode and a cathode electrode provided on an active layer 26 (proximate the active layer 30), and a common cathode electrode and an anode electrode of each channel are patterned on the auxiliary mount 30 in the form of Au electrode patterns 64. Au bumps 68 were provided in areas corresponding to the common cathode electrode and the anode electrode of each channel, and an anisotropic conductive paste 54 was filled in an area corresponding to the active layer 26. The Au bumps 68 were provided for the purpose of achieving reliable conduction. Additionally, the present structure was employed for the purpose of reducing stray light caused by reflection and scattering of light, by increasing the distance between the active layer 26 and the electrodes on the auxiliary mount 30. When heated, the anisotropic conductive paste 54 exhibits a property such that conductive substances such as silver or the like contained in the paste 54 tend to gather around other conductive members, such as the Au bumps 68, thereby providing conductivity only between itself and the Au electrode pattern 64.

A portion of the lower surface of the auxiliary mount 30, which corresponds to the active layer 26, is coated with SiN (not shown) for suppressing reflections caused by differences in refractive indices. The PD array 28 described above was a cathode-common type, but an anode-common type of PD array may be used and provides the same advantages.

As shown in step S7 of FIG. 4, spacers 32 were fixed to the auxiliary mount 30, in order to establish a gap between the optical fiber array 16 and the PD array 28.

The spacers 32 were made of borosilicate glass, particularly, Pyrex (registered trademark) glass. The gap length was set to 10 μm. Since the thickness of the PD array including the Au bumps 68 was 190 μm, taking into account the gap length, the spacers 32 had a thickness of 200 μm.

The thickness of the spacers 32 should preferably be designed to keep the gap length in a range of from 1 to 100 μm. If the gap length is less than 1 μm, the PD array 28 and the upper portions of the optical fibers 15 are highly likely to come into contact with each other, preventing the adhesive layer 60 from being distributed fully into the optical path, and tending to entrap air into the optical path. If the gap length is in excess of 100 μm, the PD detection efficiency is significantly reduced. The spacers 32, designed in this manner, were fixed in place using an ultraviolet-curable epoxy adhesive having a high bonding strength.

Figure 5B:
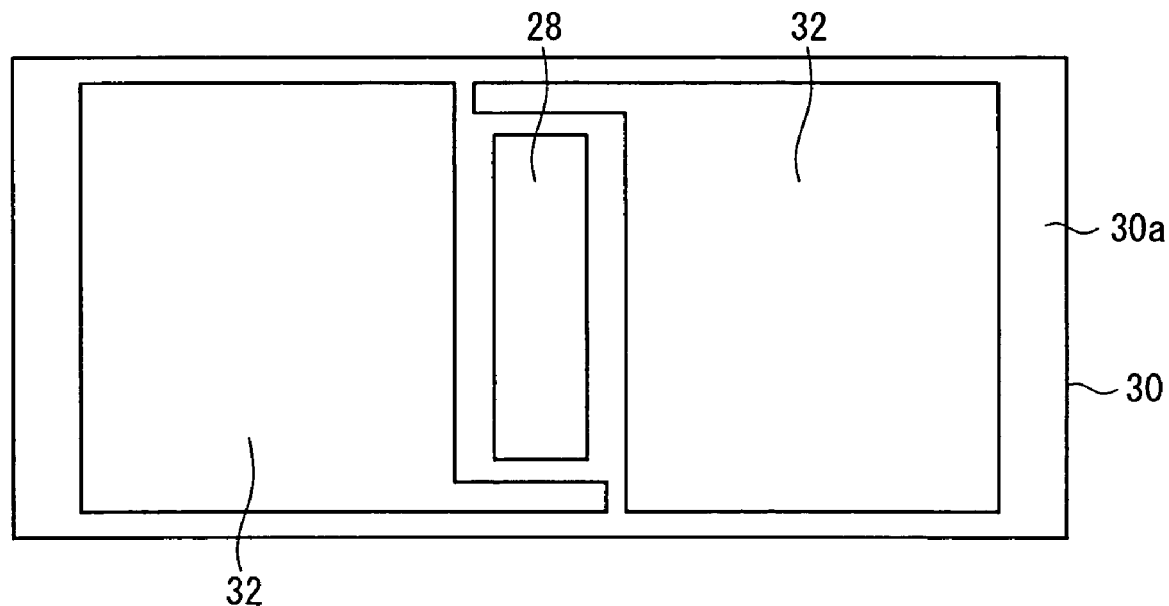
FIG. 5B is a bottom view of the spacers fixed to the lower surface of the auxiliary mount.

The spacers 32 also serve as a base for wire bonding the auxiliary mount 30, in addition to serving to determine the gap length. Since wire bonding is performed to ultrasonically join the electrodes to the wires 76, if cavities are present directly beneath the electrodes on the auxiliary mount 30, ultrasonic energy is released through the cavities, and wire bonding cannot be performed appropriately. Therefore, as shown in FIG. 5B, the spacers 32 have an L-shaped configuration, in order to prevent cavities from being formed directly beneath the electrodes.

In step S8, as shown in FIG. 4, the optical fiber array 16 was mounted onto the auxiliary mount 30. At this time, as shown in FIGS. 2 and 3, the optical fiber array 16 was mounted such that the PD array 28 and the optical fiber array 16 confronted each other.

At this time, the optical fiber array 16 was mounted such that end faces of the spacers 32 were held in direct contact with the optical fibers 15. Although the upper surfaces of the V-grooves 14 may be used as a reference, and the distance from the upper surfaces of the V-grooves 14 to the optical fibers may accurately be ascertained, since the distance also depends on the dimensions of the V-grooves 14 and the accuracy with which the optical fibers 15 are mounted in the V-grooves 14, surfaces of the optical fibers 15 that are free of the this drawback should preferably be used as a reference.

Furthermore, since the areas between end faces of the spacers 32 and the optical fibers 15 serve as important bonding areas, the portions of the spacers 32 corresponding to such areas were coated with an adhesive in advance. The adhesive used was a highly thixotropic acrylic adhesive, in order to minimize mixing between this adhesive and another adhesive used as the adhesive layer 60 to be described later.

First, a required amount of the adhesive layer 60 (see FIG. 3) was applied above the optical fibers 15, which provides an optical path for the reflected light 24. If the adhesive layer 60 is not applied in advance, then the optical path of the reflected light 24 differs between air and the adhesive layer 60. Therefore, the adhesive layer 60 is indispensable.

Since the adhesive layer 60 serves as an optical path, if an adhesive having a high Young's modulus is used as the adhesive layer 60, characteristics such as polarization dependency tend to be degraded owing to stresses in the adhesive interference as well as within the adhesive. Therefore, a gel-like silicone adhesive, having a low Young's modulus, was employed in this embodiment.

As shown in FIG. 4, in step S9 the PD array 28 was aligned. Specifically, the PD array 28 was aligned by applying light to the channels on both ends of the optical fiber array 16, whereby an active alignment was performed to maximize the detected PD power of the reflected light 24 (the detected power at the active layer 26 corresponding to both end channels). The detected PD power was monitored by applying a probe to the auxiliary mount 30, to observe output current values from the active layer 26 corresponding to both end channels.

In the present specific example, wavelengths to be used in aligning the PD array 28 were determined in order to obtain stricter characteristics. Specifically, if the wavelength band used by the present module was a C band (from 1520 to 1570 nm), then a central wavelength of 1545 nm within the band was used. If the wavelength band used by the present module was an L band (from 1570 to 1610 nm), then a central wavelength of 1590 nm within the band was used. If the wavelength band used by the present module was both C and L bands, then a central wavelength of 1565 nm between the C and L bands was used. In this manner, flatter characteristics were obtained with respect to the wavelength used.

The PD array 28 was fixed to the optical fiber array 16 by applying ultraviolet rays. At this time, ultraviolet rays were applied laterally to the alignment device at 100 mW for 10 minutes. During this stage, although the adhesive layer 60 in the vicinity of the PD array 28 was cured, the adhesive layer 60 was not cured in its entirety. Thereafter, the PD array 28 was removed from the alignment device, and ultraviolet rays were applied from the reverse side of the optical fiber array 16, at 10 mW for 5 minutes, in order to cure the adhesive layer 60 (secondary curing). During secondary curing, ultraviolet rays were applied with the lower intensity of 10 mW so as not to produce large stress strains and defects such as air bubbles within the adhesive layer 60, which resides in the optical path of the reflected light 24. Following this step, manufacturing of the optical head 10 shown in FIGS. 2 and 3 was completed.

As shown in step S10 of FIG. 4, and in FIG. 2, a so-called die-bonding process was performed to secure the optical head 10 to a central region of the package 72.

The package 72 was a metal package comprising a plurality of pins 74. The optical head 10 was fixed to the package 72 using a thermosetting adhesive.

As shown in step S11 of FIG. 4, and in FIG. 2, wire bonding process was performed between the pins 74 fixed to opposite sides of the package 72 and the electrode pads 65 (see FIG. 5A) on the auxiliary mount 30.

As shown in step S12 of FIG. 4, and in FIG. 2, the optical head 10 was packaged.

Specifically, a ring 78 was fixed in surrounding relation to the optical head 10, and the optical head 10 was sealed by a resin 80.

The ring 78, which was made of stainless steel, serves as a dam when the optical head 10 is sealed by the resin 80. In order to reduce costs, the ring 78 may alternatively be made of a resin. The ring 78 was fixed by a thermosetting adhesive. The sealing resin 80 was made of a S1 gel. The sealing resin 80 was potted so as to fully cover the wires 76, and then cured by heating and by applying ultraviolet rays thereto.

Thereafter, a cover 84 was placed over the upper opening of the ring 78 and fixed thereto. The cover 84 was in the form of a plate of stainless steel, although to reduce costs, the cover 84 may alternatively be made of a resin. The cover 84 was fixed using a thermosetting adhesive, whereby a completed product (the optical device 100A) was manufactured.

The inline power monitor module (the optical device 100A according to the present specific example), which was fabricated by the above process, was inspected as follows.

More specifically, the inline power monitor module was inspected for various items with respect to transmission-side characteristics and branch-side characteristics. With respect to transmission-side characteristics, the inline power monitor module was inspected for insertion loss, polarization dependency loss, and wavelength dependency in each channel. As a result, levels which cause no problems in use, i.e., an insertion loss <0.8 dB, a polarization dependency loss <0.05 dB, and a wavelength dependency <0.1 dB, were obtained.

With respect to branch-side characteristics, the inline power monitor module was inspected for PD detecting efficiency, polarization dependency of the PD detecting efficiency, wavelength dependency, and inter-channel crosstalk between each channel of the PD array. As a result, it was confirmed that the inline power monitor module had acceptable levels causing no problems in use, i.e., a PD detecting efficiency in a range of from 50 to 70 mA/W, a polarization dependency of the PD detecting efficiency <0.3 dB, and a wavelength dependency <0.5 dB. The inline power monitor module also was inspected for total crosstalk. Specifically, while one of the four channels was emitting light, currents flowing through the other channels were totaled, and the ratio of the current in the input channel to the sum of the currents in the other channels was expressed in 10 log. As a result, each of the channels had a crosstalk level of −34 dB or less. Thus, it was confirmed that the inline power monitor module exhibited highly excellent characteristics.

There is a tradeoff between crosstalk and PDL (polarization dependency loss), such that if the angle $\alpha$ (=reflection angle) of the slit 18 is increased, crosstalk is improved but PDL is increased. By contrast, if the angle$\alpha$ of the slit 18 is reduced, PDL is reduced but crosstalk characteristics become poorer. In this specific example of the present invention, through various efforts of optimization, both PDL and crosstalk, which have heretofore been difficult to achieve desirably, are made compatible with each other.

With the optical device 100A and method of manufacturing the same according to the present specific example, when the auxiliary mount 30 is installed on the glass substrate 12, the PD array 28 faces the optical fiber array 16 and therefore can be positioned closely to surfaces of the claddings of the optical fibers 15, thus effectively reducing size, increasing detection sensitivity, and reducing crosstalk.

The PD array 28 can be aligned in advance when it is mounted on the auxiliary mount 30. Moreover, the PD array 28 can be aligned while confirming currents with a probe applied to the electrodes on the auxiliary mount 30.

Since limitations are not imposed on distance owing to the above structure, for example, in contrast to having the auxiliary mount 30 interposed between the claddings of the optical fibers 15 and the PD array 28, according to the present invention the PD array 28 can be positioned closely to the claddings of the optical fibers 15 even though the PD array 28 is still mounted on the auxiliary mount 30.

Furthermore, according to the specific example, since only the adhesive layer 60, without other obstacles, is present fully across the PD array 28 between the claddings of the optical fibers 15 and the PD array 28, moment fulcrums caused by curing shrinkage or thermal expansion variations of the adhesive layer 60 are not exhibited in the PD array 28. Therefore, the PD array 28 and the auxiliary mount 30 are not subjected to strains, thus providing better characteristics.

Electrodes are formed on the surface of the auxiliary mount 30, which are connected to the PD array 28 by wires. The electrodes may be formed on the lower surface of the auxiliary mount 30 (i.e., the mounting surface 30a facing the optical fiber array 16) or on the upper surface of the auxiliary mount 30 (i.e., the surface remote from the mounting surface 30a). If such electrodes are formed on the upper surface of the auxiliary mount 30, as shown in FIG. 5A, through holes 66 may be formed in the auxiliary mount 30, wherein the electrode patterns 64 formed on the mounting surface 30a and the electrode pads 65 formed on the upper surface of the auxiliary mount 30 are electrically connected to each other via the through holes 66.

To ensure stable uniformity of the adhesive layer 60, the auxiliary mount 30 should preferably be fixed rigidly in position. Moreover, the distance between the claddings of the optical fibers 15 and the PD array 28 should be kept as short as possible in order to prevent the reflected light 24 from spreading. In addition, the adhesive layer 60 should be made thin to reduce stresses developed over its entirety. Although the adhesive layer 60 lies in the optical path of the reflected light 24, the adhesive layer 60 should preferably be thin in order to minimize unstable optical characteristics.

The above conditions, particularly, the distance between the claddings of the optical fibers 15 and the PD array 28 should be controlled with high accuracy. From this standpoint, the glass substrate 12 should preferably be installed while using the mounting surface 30a of the auxiliary mount 30 as a reference.

Figure 6:
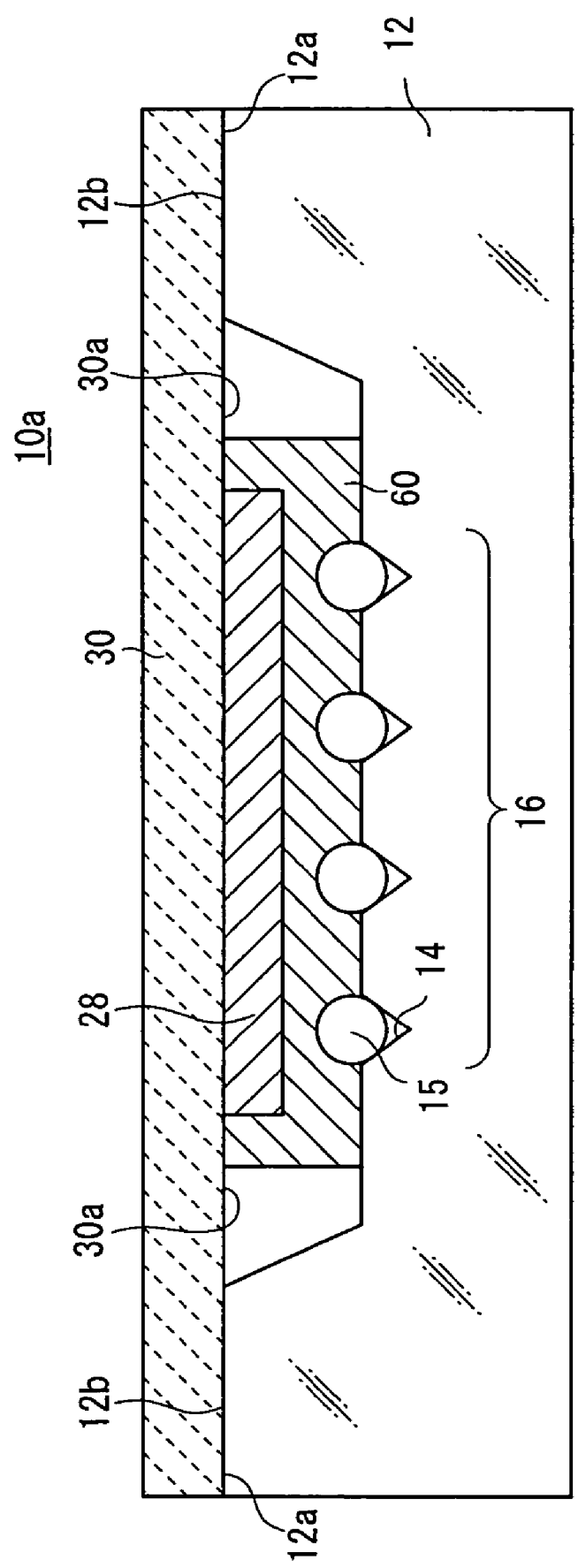
FIG. 6 is a cross-sectional view showing essential parts of an optical head according to a modified example.

An arrangement, which satisfies the above requirements, comprises an optical head 10a according to a modified example, as shown in FIG. 6. The optical head 10a has side walls 12a extending upwardly on both sides of the glass substrate 12, wherein the mounting surface 30a of the auxiliary mount 30 is installed using the upper end faces 12b of the side walls 12a as a reference.

Inasmuch as the PD array 28 is mounted on the mounting surface 30a of the auxiliary mount 30, the distance from the mounting surface 30a to the surface of the PD array 28, or to the active layer 26, is accurately assured. Since the distance from a horizontal plane, including the upper end faces 12b of the side walls 12 of the glass substrate 12, to a horizontal plane defined by centers of the optical fibers 15 remains substantially constant, the distance can accurately be ascertained and controlled. When the mounting surface 30a is installed on the upper end faces 12b of the side walls 12, the distance between the claddings of the optical fibers 15 and the PD array 28 can be managed and maintained with high accuracy. That is, the distance between the claddings of the optical fibers 15 and the PD array 28 can accurately be set to a desired distance. Furthermore, since the auxiliary mount 30 has a mounting surface 30a, which is fixed to the glass substrate 12, the auxiliary mount 30 is stably fixed in position.

As shown in FIG. 2, it is also preferable for spacers 32 to be fixed to the mounting surface 30a of the auxiliary mount 30, and for the glass substrate 2 to be installed using end faces of the spacers 32 as a reference.

Since the spacers 32 are of a simple shape, the thickness of the spacers 32 can accurately be maintained, and the function of the spacers 32 can be performed without fail. That is, the distance between the claddings of the optical fibers 15 and the PD array 28 can accurately be set to a desired distance.

In contrast to the structure in which the glass substrate 12 has side walls 12a (see FIG. 6), the glass substrate 12 can be constructed without involving a complex shape, which is more advantageous in terms of cost. According to another possible arrangement, glass may be deposited on the glass substrate 12, and the upper surface of such deposited glass can be used as a reference surface. However, this arrangement is more expensive, and therefore the above structure, in which spacers 32 are provided on a mounting surface 30*a* of the auxiliary mount 30, provides a greater cost advantage.

As described above, the adhesive layer 60 is responsible for unstable optical characteristics, which can result in unfavorable polarization dependency and large wavelength dependency. The characteristics of the adhesive layer 60 may themselves become factors producing such unstable optical characteristics. For example, is difficult to cure an adhesive layer 60 so as to be optically uniformly throughout its inside. Furthermore, since the adhesive layer 60 is made of resin, its coefficient of thermal expansion is large, and temperature variations thereof are also large.

One effective solution to the above problems is to make the adhesive layer 60 lying in the optical path of the reflected light 24 to be as thin as possible. The thickness of the adhesive layer 60 should preferably be 100 µm or less because thickness in excess of 100 µm tends to render the characteristics (optical characteristics, etc.) thereof unstable. More preferably, a thickness of 30 µm or less does not produce excessive stresses and allows the adhesive to be cured into the adhesive layer 60. If a reverse-side-incident type of PD array 28 is used, as in the present specific example, then the thickness of the adhesive layer can be easily set to 60 to 30 µm or less.

Conversely, if it is too thin, the adhesive layer 60 may not be able to exhibit its inherent performance. Specifically, if the adhesive layer 60 is too thin, the materials of the adhesive layer 60 may not be present uniformly within the adhesive layer 60, but rather, only selectively flowable materials may exist in the adhesive layer 60, which fail to achieve stable characteristics (optical characteristics, etc.) in each fabricated product. Therefore, to obtain stable characteristics, the thickness of the adhesive layer 60 should be 3 µm or greater.

The optical device and the method of manufacturing same according to the present invention are not limited to the above embodiments and examples, but may take various arrangements without departing from the scope of the invention.

INDUSTRIAL APPLICABILITY

As has been described above, with the optical device and the method of manufacturing the same according to the present invention, it is possible to position the detecting surface of a photodetector device closely to the surface of an optical transmitting means (e.g., the surface of the cladding of an optical fiber), thus effectively reducing size, increasing detection sensitivity, and reducing crosstalk.

The invention of claimed is:

1. An optical device comprising:
   a first substrate;
   one or more optical transmitting means mounted on said first substrate;
   a branch member for reflecting a portion of light transmitted through said one or more optical transmitting means while allowing another portion of the light to pass through said optical device;
   an optical element fixedly mounted by an adhesive layer on an optical path of reflected light generated by at least said reflecting function, out of said optical transmitting means, said adhesive layer being positioned between said optical transmitting means and said optical element; and
   a second substrate on which said optical element is mounted;
   wherein said second substrate has a mounting surface on which said optical element is mounted and which faces said first substrate, and
   wherein said first substrate and said mounting surface of said second substrate are disposed with a spacer interposed therebetween.

2. An optical device according to claim 1, wherein said first substrate is installed based on said mounting surface, used as a reference, of said second substrate.

3. An optical device according to claim 1, wherein said spacer is separate from said first substrate and said second substrate.

4. An optical device according to claim 1, wherein said spacer is integral with said first substrate, and said mounting surface of said second substrate is installed based on an end face, used as a reference, of said spacer.

5. An optical device comprising:
   a first substrate;
   one or more optical transmitting means mounted on said first substrate;
   a branch member for reflecting a portion of light transmitted through said one or more optical transmitting means while allowing another portion of the light to pass through said optical device;
   an optical element fixedly mounted by an adhesive layer on an optical path of reflected light generated by at least said reflecting function, out of said optical transmitting means, said adhesive layer being positioned between said optical transmitting means and said optical element and having a thickness in a range from 3 µm to 100 µm; and
   a second substrate on which said optical element is mounted, wherein said second substrate has a mounting surface on which said optical element is mounted and which faces said first substrate.

6. A method of manufacturing an optical device having:
   a first substrate;
   one or more optical transmitting means mounted on said first substrate;
   a branch member for reflecting a portion of light transmitted through said one or more optical transmitting means while allowing another portion of the light to pass through said optical device;
   an optical element fixedly mounted by an adhesive layer on an optical path of reflected light generated by at least said reflecting function, out of said optical transmitting means, said adhesive layer being positioned between said optical transmitting means and said optical element;
   a second substrate on which said optical element is mounted; and
   a spacer interposed between said first substrate and said second substrate;
   said method comprising the steps of:
   installing said one or more optical transmitting means on said first substrate;
   installing said optical element on a mounting surface of said second substrate; and
   installing said mounting surface of said second substrate in facing relation to said first substrate with said spacer and said adhesive layer being interposed therebetween.

* * * * *